(12) United States Patent
Thomas et al.

(10) Patent No.: US 7,548,188 B2
(45) Date of Patent: Jun. 16, 2009

(54) PRECISION RADIO FREQUENCY DELAY DEVICE

(75) Inventors: Steven H. Thomas, Brooklyn Center, MN (US); Glen B. Backes, Maple Grove, MN (US); Timothy J. Reilly, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 280 days.

(21) Appl. No.: 11/462,909

(22) Filed: Aug. 7, 2006

(65) Prior Publication Data

US 2009/0058716 A1     Mar. 5, 2009

(51) Int. Cl.
*G01S 7/02* (2006.01)
*H03H 11/26* (2006.01)
*G01S 7/40* (2006.01)

(52) U.S. Cl. .................. 342/172; 342/103; 342/175; 327/261

(58) Field of Classification Search ................ 342/172, 342/175, 124, 98–103; 327/261–290; 335/28; 380/35, 218; 324/617
See application file for complete search history.

(56) References Cited

U.S. PATENT DOCUMENTS

| 4,661,818 A | 4/1987 | Riffiod et al. |
| 4,679,168 A | 7/1987 | Conway et al. |
| 4,968,907 A * | 11/1990 | Pepper ........................ 327/286 |
| 4,982,196 A * | 1/1991 | Thomas et al. .............. 342/172 |
| 5,160,933 A | 11/1992 | Hager |
| 5,262,786 A | 11/1993 | Cross |
| 5,384,541 A * | 1/1995 | Chu et al. ................... 324/617 |
| 5,801,601 A | 9/1998 | Gayle |
| 2004/0017847 A1 | 1/2004 | Alberth, Jr. et al. |

\* cited by examiner

*Primary Examiner*—Thomas H Tarcza
*Assistant Examiner*—Cassi Galt
(74) *Attorney, Agent, or Firm*—Fogg & Powers LLC

(57) ABSTRACT

A method of delaying propagation of a radio frequency (RF) signal through a circuit is described. The method comprises receiving data that represents a delay time interval, providing an RF signal when a start pulse triggers a memory device, initiating a count through the delay time interval based on receipt of a start pulse, and outputting the RF signal after the delay time interval has expired.

14 Claims, 3 Drawing Sheets

US 7,548,188 B2

PRECISION RADIO FREQUENCY DELAY DEVICE

BACKGROUND OF THE INVENTION

This invention relates generally to delay devices used in electronic circuits, and more specifically, to a radio frequency (RF) delay device and system for radar altimeter calibration.

Many aircraft require better accuracy from a radar altimeter than presently exists. Generally, the accuracy becomes more important at low altitudes where aircraft perform controlled flight into and just above terrain. For example, accuracy becomes more important during landing, low altitude equipment drops, precision hovering, detection avoidance, and nap of the earth flying. Some of these applications include unmanned vehicles where landing is controlled remotely and there is little room for error. The low altitude region of a radar altimeter, where the accuracy becomes more important, is usually defined as from 0 to 50 feet. Laser systems have been proposed but problems, for example, with weather, errors relative to aircraft attitude with a collimated beam, and inability to see through dust, rain, fog and other environments have negated their use for critical radar altimeter applications.

The total accuracy of a radar altimeter system is a function of sensor accuracy and ground return signal accuracy. Sensor accuracy is diminished by variations due to environmental changes, including but not limited to changes in temperature and humidity, and affected by variations in signal amplitude, risetime, bandwidths, pulse or gate widths, and clock frequencies.

In contrast to sensor accuracy where the error is caused by variations within the radar altimeter system, ground return signal accuracy is a function of the radar signal from when it leaves a transmit antenna to when it is received at a receive antenna. Ground return signal errors are caused by vehicle attitude, the external environment including but not limited to rain, fog, and dust, and terrain characteristics and associated reflection coefficient characteristics including shaping functions. The above described errors are difficult to detect and correct in a radar altimeter. As a result, wide accuracy tolerances are utilized to account for the various error sources.

Radar altimeters are currently tested for accuracy by either acoustic or optical delay lines. These delay lines are external of the radar altimeter and used mostly in production testing rather than while a radar altimeter is in use. These delay lines are also very large, often larger than a radar altimeter itself, and expensive.

BRIEF DESCRIPTION OF THE INVENTION

In one aspect, a method of delaying propagation of a radio frequency (RF) signal through a circuit is provided. The method comprises receiving data that represents a delay time interval, providing an RF signal when a start pulse triggers a memory device, initiating a count through the delay time interval based on receipt of a start pulse, and outputting the RF signal after the delay time interval has expired.

In another aspect, a programmable radio frequency (RF) delay device is provided. The programmable RF delay device comprises a frequency synthesizer that includes an input register and a reference input. The input register is configured to receive data relating to a delay time interval. The programmable RF delay device further comprises an RF signal source and a logic circuit configured to logically combine an output of the RF signal source and a start pulse to initiate a count through the delay time interval. An output of the logic circuit is coupled to the reference input of the frequency synthesizer. The frequency synthesizer provides an output of the RF signal when the count reaches the set delay time interval.

DETAILED DESCRIPTION OF THE INVENTION

A radio frequency (RF) delay device is described. In one specific embodiment, the delay device is implemented within a radar altimeter to significantly improve the accuracy of the radar altimeter.

Figure 1:
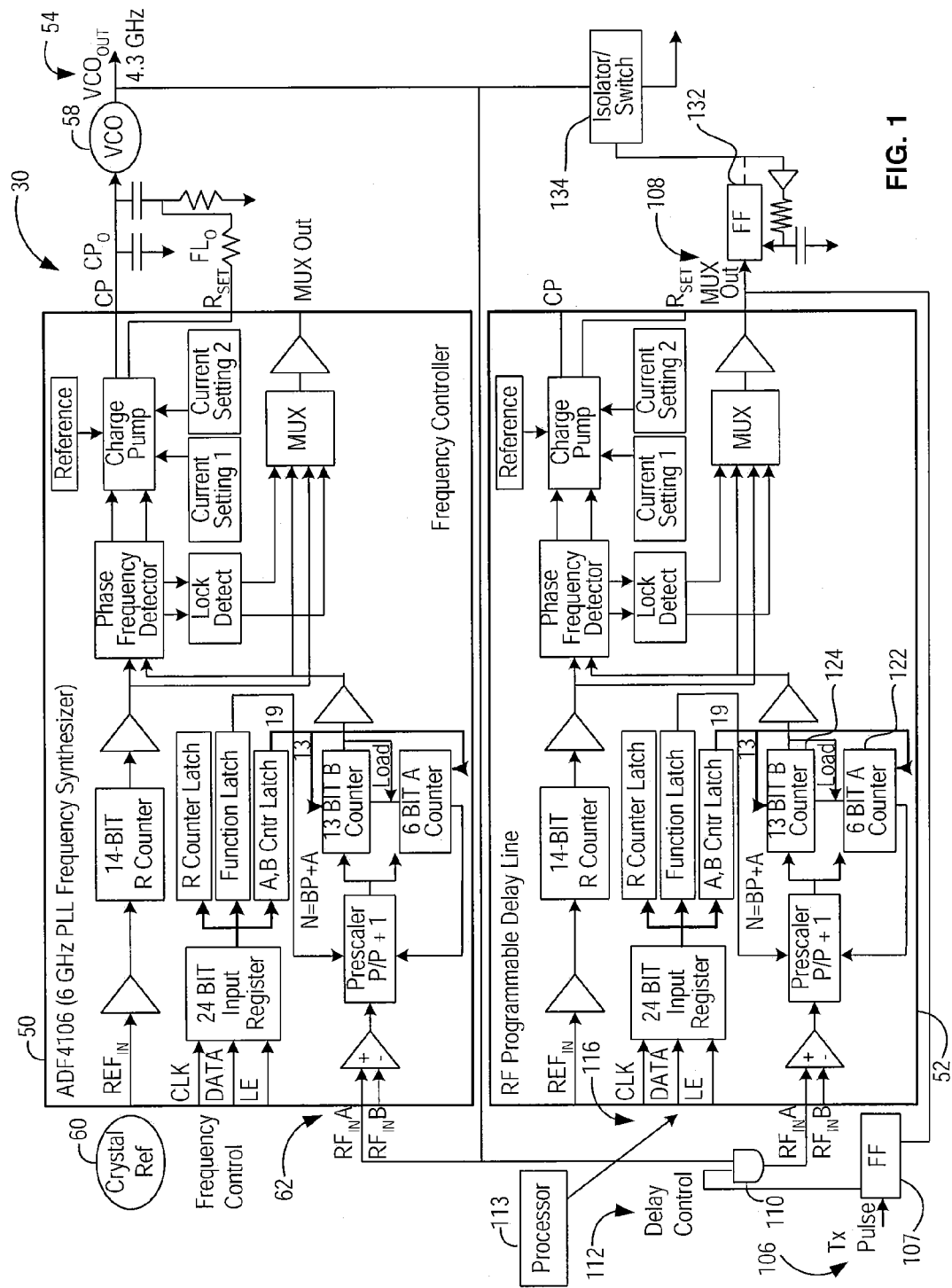
FIG. 1 is block diagram of one embodiment of a delay device.

Referring now to the drawings, FIG. 1 is a block diagram of one embodiment of a programmable RF delay device 30. Programmable RF delay device 30 includes two phase locked loop (PLL) frequency synthesizers 50 and 52. Frequency synthesizers 50 and 52 are used in modern coherent radar systems to maintain a stable operating frequency and phase. In one embodiment, synthesizers 50 and 52 are fabricated using the ADF4106 6 GHz PLL Frequency Synthesizer, manufactured by Analog Devices, Inc. of Norwood, Mass. It is also possible to create frequency synthesizers similar to synthesizers 50 and 52 from discrete components.

In one specific embodiment, synthesizers 50 and 52 are configured to perform different functions. Synthesizer 50 provides a stable operating frequency for delay device 30 while synthesizer 52 is utilized in providing the delay function. In the illustrated embodiment, synthesizer 50 provides a 4.3 GHz output signal (VCOout) 54 to synthesizer 52. Synthesizer 50 along with a voltage controlled oscillator (VCO) 58, and a crystal controlled oscillator 60 form a PLL circuit. Crystal controlled oscillator 60 may be, for example, a temperature compensated oscillator. VCO 58 provides VCOout 54 which is fed back into an RF input 62 of synthesizer 50. VCOout 54 is also provided as the operating frequency for synthesizer 52. The accuracy of delay device 30 is a function of the stability of the operating frequency provided by synthesizer 50. The PLL configuration along with a temperature compensated crystal controlled oscillator provide this accurate operating frequency. VCOout 54 can be programmed and set to various frequencies for a frequency agile radar system, which is often utilized to reduce the intercept probability of the radar.

A modulation pulse 106, for example, as received from a radar transmitter, starts the timing within delay device 30. The leading edge of modulation pulse 106 triggers a switch or memory device, for example, a flip-flop 107, which also receives a fed-back output 108 of synthesizer 52. The signal from flip-flop 107 is input into a logic gate 110 along with VCOout 54. The operation performed at logic gate 110 determines when VCOout 54 is provided to synthesizer 52. A delay count 112 is set by a system processor 113 at a serial data input 116. Delay count 112 is then loaded into an "A" counter 122 and a "B" counter 124. VCOout 54 is used to count down from the preset delay 112 and at the end of the count down, a delayed signal is output at MUX Out pin 108.

The delayed signal triggers a switch or memory device, for example, a flip-flop 132, which drives an isolator/switch 134. A feedback circuit on flip-flop 132 controls the output pulse width. As a result, delayed pulse 108 modulates VCOout 54 producing a simulated delay. In a specific embodiment, the delayed pulse 108 is provided to a radar altimeter receiver and used as a calibration circuit.

Figure 2:
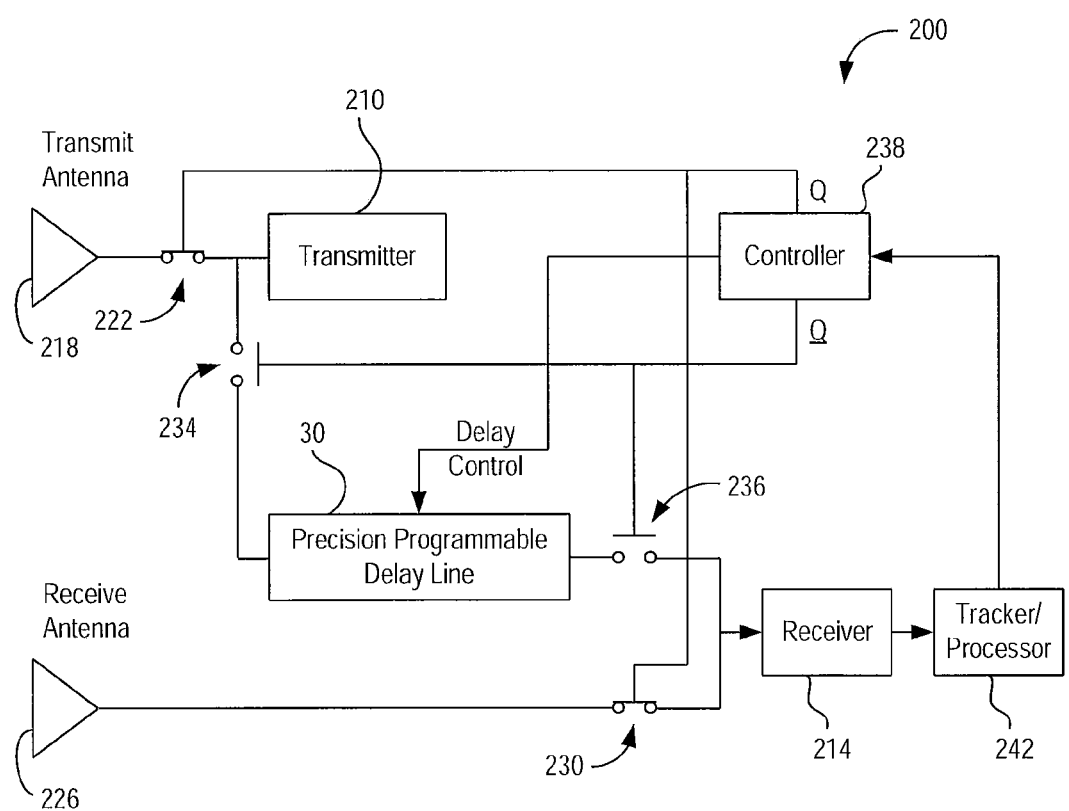
FIG. 2 is a block diagram of a radar altimeter that includes the delay device of FIG. 1.

FIG. 2 is a simplified block diagram of an RF portion of a radar altimeter 200. Radar altimeter 200 includes a transmitter 210 and a receiver 214. Transmitter 210 is connected to a transmit antenna 218 through a switch 222, and receiver 214 is connected to a receive antenna 226 through a switch 230. Transmitter 210 is also connected to delay device 30 through a switch 234, and delay line 30 is connected to receiver 214 through a switch 236. A controller 238 controls switches 222, 230, 234, and 236 within radar altimeter 200 and also provides a delay control to programmable delay device 30 according to instructions from a system processor 242. System processor 242 receives signals from receiver 214 and is programmed to provide receiver data to external systems.

In the embodiment of FIG. 2, delay device 30 is utilized in a radar altimeter system that provides compensation for any variations or errors within the transmitter 210 and the sensors, for example, receiver 214, antenna 226, and interconnections therebetween. To achieve the compensation, transmitter 210 is configured to periodically send a transmit signal to delay device 30, rather than to transmit antenna 218. Controller 238, by changing the state of switches 222, 230, 234, and 236, chooses between normal radar altimeter operation where a transmit signal is transmitted from transmit antenna 218 and received by receive antenna 226, and a simulated test mode of operation where a transmit signal is sent to delay device 30, delayed for a set time interval, and sent to receiver 214.

When in the simulated test mode of operation where transmitter 210 is connected to delay device 30, the transmit signal is delayed within delay device 30 by a known time interval, relevant to a simulated altitude, to simulate normal operation of radar altimeter 200. More specifically, the time the signal is delayed is a simulation of the time interval between when a signal leaves transmit antenna 218, is reflected off a surface, and received at receive antenna 226. The time the signal is delayed, like the time between when a signal leaves transmit antenna 218, is reflected off a surface, and received at receive antenna 226, is a function of altitude. Although the delayed transmit signal is a simulation of the normal operation of radar altimeter 200, delay device 30 eliminates all sources of errors other than sensor errors. The time interval between when a transmit signal leaves transmit antenna 218 and is received by receive antenna 226 corresponds to a specific altitude. If the time interval is set and accurately reproduced by delay device 30, but radar altimeter 200 does not display the altitude that should correspond with that set time interval, there are one or more sensor errors within radar altimeter 200. In one numerical example, if programmable delay device 30 is set by system processor 242 for a delay of 9.6 nanoseconds (nsec), since a transmitted radar signal takes 2.0334 nsec to travel one foot, this delay represents a simulated altitude of 4.72 feet.

The sensor errors discussed above may cause the radar altimeter to display an altitude that does not correspond to the actual altitude that, according to the mathematics of radar altimeter operation, should be displayed for a set delay interval. Delay device 30, in combination with processor 242, compensates for the sensor errors. In one embodiment, a calibration algorithm within processor 242 compensates for the sensor errors at a multitude of calibration altitudes. Radar altimeter 200 uses the calibration algorithm to adjust a measured altitude to remove the sensor errors. In one numerical example, delay device 30 is programmed in 0.010 nsec increments that can range from delay intervals of 9.6 nsec to 90 nsec. These delay intervals correspond to altitudes from 4.72 feet to 44 feet which simulate the low altitude region of a radar altimeter. The 0.010 nsec delay increments correspond to 0.0049 foot altitude increments (i.e., simulated altitudes every 0.0049 feet). Sensor errors are determined at each simulated altitude, stored in a memory, and in combination with the sensor errors determined at the other simulated altitudes, a calibration algorithm is created that is continuous throughout a low altitude range.

In one embodiment, because of limited processing time, a select number of simulated altitudes are chosen. In one specific embodiment, eight calibration points are processed to provide five foot increments. Curve fitting utilizing, for example, linear or quadratic algorithms, provides a very accurate calibration algorithm in the low altitude region.

In one specific numerical example, if delay device 30 is set to provide a delay of 20.334 nsec, with no errors, the radar altimeter should display a corresponding altitude of ten feet. If, after receiving a pulse delayed by 20.334 nsec the radar altimeter displays an altitude of nine feet, sensor errors are causing a one foot variance. Continuing the example, when delay device 30 is not connected, and a return signal is being received at receiver 214, if the radar altimeter measures that it is at an altitude of ten feet, the calibration algorithm will be applied, removing the one foot of sensor errors, and the radar altimeter will display an altitude of eleven feet. The one foot difference is caused by errors or variations in receiver 214 and processor 242, for whatever reason. The errors are common mode compensated because a known precision signal is periodically measured and any variance will also be in the actual altitude measurement since they are both processed in the same circuitry.

Delay device 30 provides a very accurately delayed pulse to receiver 214. In one specific embodiment, the accuracy of delay device 30 is less than 0.7 nsec from −40° C. to 85° C. This accuracy corresponds to a variance of 0.35 feet.

Figure 3:
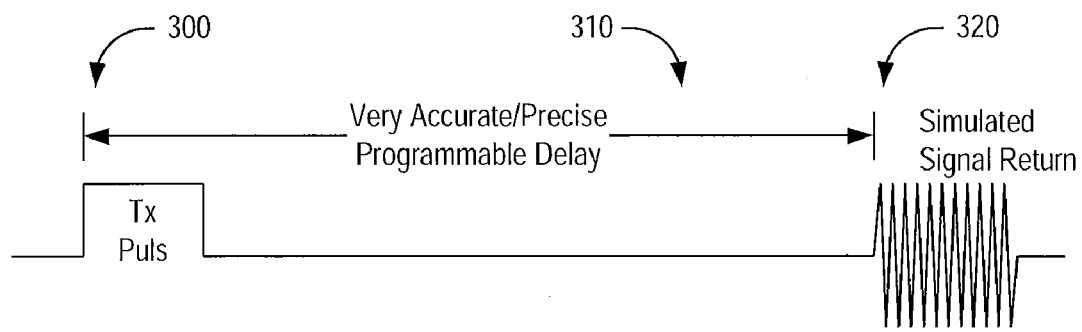
FIG. 3 is a frequency chart showing a simulated return pulse output by the delay device of FIG. 1.

FIG. 3 is a frequency chart showing a simulated return pulse output by the delay device of FIG. 1. In one specific embodiment, controller 238 disconnects transmitter 210 from transmit antenna 218 utilizing switch 222, and connects transmitter 210 to delay device 30 utilizing switch 234. A leading edge of a transmit pulse 300, as shown in FIG. 3, begins the timing of a delay interval 310. Delay device 30 utilizes an operating frequency, which for example, can be created within delay device 30 or provided to delay device 30 by an external system, to count down from a preset delay. When the count down is completed, delay device 30 outputs a simulated signal return 320. In the embodiment of FIG. 2, controller 238 opens switch 230 and closes switch 236 to connect delay device 30 to receiver 214.

Delay device 30 fulfills a need for a small, inexpensive, and accurate programmable RF delay device. The above described delay device can be utilized to significantly improve the accuracy of a radar altimeter through periodic calibration made possible by background testing, and also be utilized within other circuits where a small, inexpensive, and accurate programmable RF delay device would be beneficial.

While the invention has been described in terms of various specific embodiments, those skilled in the art will recognize that the invention can be practiced with modification within the spirit and scope of the claims.

What is claimed is:

1. A method of delaying propagation of a radio frequency (RF) signal through a circuit, said method comprising:
   receiving data that represents a delay time interval;
   providing the RF signal from a first phase lock loop frequency synthesizer to a second phase lock loop frequency synthesizer;

initiating a count through the delay time interval based on receipt of a start pulse; and outputting the RF signal from the second phase lock loop frequency synthesizer after the delay time interval has expired.

2. The method of claim 1 wherein receiving data that represents a delay time interval comprises clocking the data into a register.

3. The method of claim 1 wherein providing the RF signal comprises providing, to a memory device, the start pulse and an output from the delay device.

4. The method of claim 1 wherein initiating a count through the delay time interval based on receipt of a start pulse comprises logically combining the RF signal and the start pulse.

5. The method of claim 1 wherein initiating a count through the delay time interval based on receipt of a start pulse comprises:

inputting the start pulse into a memory device; and logically combining an output of the memory device and the RF signal.

6. The method of claim 5 wherein the memory device comprises a flip-flop.

7. The method of claim 5 wherein logically combining an output of the memory device and the RF signal comprises logically ANDing the output of the memory device and the RF signal.

8. A programmable radio frequency (RF) delay device comprising:

a second phase lock loop frequency synthesizer comprising an input register and a reference input, said input register configured to receive data relating to a delay time interval;

an RF signal source including a first phase lock loop frequency synthesizer; and a logic circuit configured to logically combine an output of said RF signal source and a start pulse to initiate a count through the delay time interval, an output of said logic circuit coupled to said reference input, said second phase lock loop frequency synthesizer providing an output of the RF signal when the count reaches the set delay time interval.

9. The programmable RF delay device of claim 8 wherein said RF signal source comprises a phase locked loop circuit.

10. The programmable RF delay device of claim 8 wherein said logic circuit comprises:

a memory device configured to receive a start pulse and a feedback output of the RF signal from said second phase lock loop frequency synthesizer; and an AND gate configured to logically combine an output of said RF signal source with an output from said memory device.

11. The programmable RF delay device of claim 8 wherein said memory device comprises a flip-flop.

12. A delay device comprising:

a second phase lock loop frequency synthesizer comprising an input register configured to receive data relating to a delay time interval and an output; and a logic circuit configured to logically combine a radio frequency signal source and a start pulse to initiate a count through the delay time interval, said radio frequency signal source including a first phase lock loop frequency synthesizer and a voltage controlled oscillator said second phase lock loop frequency synthesizer providing an RF signal at said output when the count reaches a value associated with the set delay time interval.

13. The delay device of claim 12 wherein said logic circuit comprises:

a memory device configured to receive the start pulse and the RF signal from said first phase lock loop frequency synthesizer; and an AND gate configured to logically combine the RF signal with an output from said memory device.

14. The delay device of claim 12 wherein said memory device comprises a flip-flop.

\* \* \* \* \*